(12) United States Patent
Oliver et al.

(10) Patent No.: US 11,715,026 B2
(45) Date of Patent: Aug. 1, 2023

(54) QUANTUM MEASUREMENT EMULATION ERROR MITIGATION PROTOCOL FOR QUANTUM COMPUTING

(71) Applicant: Massachusetts Institute of Technology, Cambridge, MA (US)

(72) Inventors: William Oliver, Arlington, MA (US); Seth Lloyd, Wellesley, MA (US); Danna Rosenberg, Arlington, MA (US); Michael O'Keeffe, Cambridge, MA (US); Amy Greene, Mount Bethel, PA (US); Morten Kjaergaard, Cambridge, MA (US); Mollie Schwartz, Cambridge, MA (US); Gabriel Samach, Cambridge, MA (US); Iman Marvian Mashhad, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 260 days.

(21) Appl. No.: 16/917,710

(22) Filed: Jun. 30, 2020

(65) Prior Publication Data
US 2021/0406749 A1    Dec. 30, 2021

(51) Int. Cl.
*G06N 10/00* (2022.01)
*G06F 11/00* (2006.01)
(Continued)

(52) U.S. Cl.
CPC ........... *G06N 10/00* (2019.01); *G06F 11/004* (2013.01); *H03M 13/6508* (2013.01); *H10N 60/84* (2023.02)

(58) Field of Classification Search
CPC ........ G06N 10/00; G06N 10/70; G06N 10/40; G06N 10/20; G06F 11/004; H01L 39/10; H03M 13/6508
(Continued)

(56) References Cited

U.S. PATENT DOCUMENTS

| 2010/0251049 A1* | 9/2010 | Goto ..................... H03M 13/19 |
| | | 714/E11.032 |
| 2019/0042392 A1* | 2/2019 | Matsuura ............... G06N 10/00 |

(Continued)

OTHER PUBLICATIONS

Andersen et al., Repeated Quantum Error Detection in a Surface Code. ArXiv preprint arXiv:1912.09410v1. Dec. 19, 2019;1:1-12.
(Continued)

*Primary Examiner* — James C Kerveros
(74) *Attorney, Agent, or Firm* — Wolf, Greenfield & Sacks, P.C.

(57) ABSTRACT

Systems and methods for performing open-loop quantum error mitigation using quantum measurement emulations are provided. The open-loop quantum error mitigation methods do not require the performance of state readouts or state tomography, reducing hardware requirements and increasing overall computation speed. To perform a quantum measurement emulation, an error mitigation apparatus is configured to stochastically apply a quantum gate to a qubit or set of qubits during a quantum computational process. The stochastic application of the quantum gate projects the quantum state of the affected qubits onto an axis, reducing a trace distance between the quantum state and a desired quantum state.

20 Claims, 14 Drawing Sheets

(51) Int. Cl.
  *H03M 13/00* (2006.01)
  *H10N 60/84* (2023.01)
(58) Field of Classification Search
  USPC .......................................................... 714/47.1
  See application file for complete search history.

(56) References Cited

U.S. PATENT DOCUMENTS

| | | | |
|---|---|---|---|
| 2019/0303788 A1 | 10/2019 | Kelly et al. | |
| 2020/0074035 A1* | 3/2020 | Javadiabhari | G06F 30/337 |
| 2020/0119748 A1* | 4/2020 | Lucarelli | H03M 13/2906 |
| 2020/0242208 A1* | 7/2020 | Daraeizadeh | G06F 11/1068 |
| 2021/0035006 A1* | 2/2021 | Martinis | G06N 10/00 |
| 2021/0125096 A1* | 4/2021 | Puri | G06N 10/00 |
| 2021/0287125 A1* | 9/2021 | Maslov | G06F 17/16 |

OTHER PUBLICATIONS

Iverson et al., Coherence in logical quantum channels. ArXiv preprint arXiv: 1912.04319v2. Apr. 23, 2020;2:1-113.
Jones et al., Layered architecture for quantum computing. Physical Review X. Jul. 31, 2012;2(3):031007. 27 pages.
Kern et al., Quantum error correction of coherent errors by randomization. ArXiv preprint arXiv: quant-ph/0407262v1. Jul. 30, 2004;1:1-4.
Kern et al., Selective recoupling and stochastic dynamical decoupling. ArXiv preprint arXiv: quant-ph/0602167v1. Feb. 20, 2006;1:1-9.
Kjaergaard et al., Programming a quantum computer with quantum instructions. ArXiv preprint ArXiv: 2001.08838v3. Dec. 28, 2020;3:24 pages.
McClean et al., Decoding quantum errors with subspace expansions. ArXiv preprint arXiv: 1903.05786v1. Mar. 14, 2019;1:1-12.
Ball et al., Walsh-synthesized noise-filtering quantum logic. ArXiv preprint ArXiv:1410.1624v1. Oct. 7, 2014;1:1-51.
Bravyi et al., Correcting coherent errors with surface codes, npj Quantum Information. Oct. 31, 2018;4(1):1-6.
Master, Quantum computing under real-world constraints: Efficiency of an ensemble quantum algorithm and fighting decoherence by gate design. Cyrus Phiroze Master. Sep. 2005:166 pages.
Mavadia et al., Prediction and real-time compensation of qubit decoherence via machine learning. Nature communications. Jan. 16, 2017;8(1):1-6.
Sarovar et al., Error suppression and error correction in adiabatic quantum computation: non-equilibrium dynamics. New Journal of Physics. Dec. 31, 2013;15(12):125032. 37 pages.
Young et al., Error suppression and error correction in adiabatic quantum computation: Techniques and challenges. Physical Review X. Nov. 13, 2013;3(4):041013. 13 pages.

\* cited by examiner

○ Identity
● *Deterministic Gate Application*
○ Stochastic Gate Application

QUANTUM MEASUREMENT EMULATION ERROR MITIGATION PROTOCOL FOR QUANTUM COMPUTING

GOVERNMENT SUPPORT

This invention was made with Government support under Grant No. FA8702-15-D-0001 awarded by the U.S. Air Force, and under Grant No. W911NF-18-1-0411 awarded by the Army Research Office (ARO). The Government has certain rights in the invention.

BACKGROUND

Classical computing systems are often subject to sources of noise, which can introduce errors into stored or transmitted data. Classical error detection and correction schema add redundancy to the transmitted or stored information to enable reliable delivery or recovery of data. Such classical schema can sample the transmitted or stored information to determine if the data has been corrupted and/or to correct the corrupted data.

Quantum computation, on the other hand, uses quantum mechanical phenomena to encode and process information in ways that cannot be performed by classical information processing. However, such quantum information processing systems cannot utilize classical error correction procedures because measuring the state of the quantum information system will collapse any superposition and/or entangled states, per the Heisenberg uncertainty principle.

SUMMARY

The following is a non-limiting summary of some embodiments of the present application. Some embodiments are directed to a system comprising a first qubit and an apparatus coupled to the first qubit. The apparatus is configured to stochastically apply a quantum gate to the first qubit.

In some embodiments, the first qubit is a superconducting qubit.

In some embodiments, the apparatus is configured to stochastically apply the quantum gate with a probability of 0.5. In some embodiments, the apparatus uses a random number generator to stochastically determine whether to apply the quantum gate.

In some embodiments, the system further comprises a second qubit coupled to the first qubit, wherein the apparatus is coupled to the second qubit and configured to stochastically apply the quantum gate to the first qubit and the second qubit.

Some embodiments are directed to a method of performing error mitigation. The method comprises stochastically determining whether to apply a quantum gate to a first qubit and applying, in response to stochastically determining to apply the quantum gate, the quantum gate to the first qubit.

Some embodiments are directed to at least one computer-readable storage medium encoded with computer-executable instructions that, when executed by a computer, cause the computer to carry out a method. The method comprises stochastically determining whether to apply a quantum gate to a first qubit and applying, in response to stochastically determining to apply the quantum gate, the quantum gate to the first qubit.

In some embodiments, the method further comprises stochastically determining whether to apply the quantum gate to a second qubit coupled to the first qubit; and applying, in response to stochastically determining to apply the quantum gate, the quantum gate to the first qubit and the second qubit.

In some embodiments, the method further comprises before stochastically determining whether to apply the quantum gate to the first qubit and the second qubit, applying an arbitrary quantum gate to the first qubit and the second qubit.

In some embodiments, stochastically determining whether to apply the quantum gate comprises using a random number generator. In some embodiments, stochastically determining whether to apply the quantum gate comprises stochastically determining whether to apply the quantum gate with a probability of 0.5.

In some embodiments, applying the quantum gate to the first qubit comprises applying a quantum gate configured to perform a rotation of $\pi$ radians.

In some embodiments, the first qubit is a superconducting qubit and applying the quantum gate to the first qubit comprises applying a microwave signal to the first qubit.

In some embodiments, applying the quantum gate comprises sending information to an apparatus configured to apply the quantum gate to the first qubit, the information comprising instructions that, when executed by the apparatus, cause the apparatus to apply the quantum gate to the first qubit.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
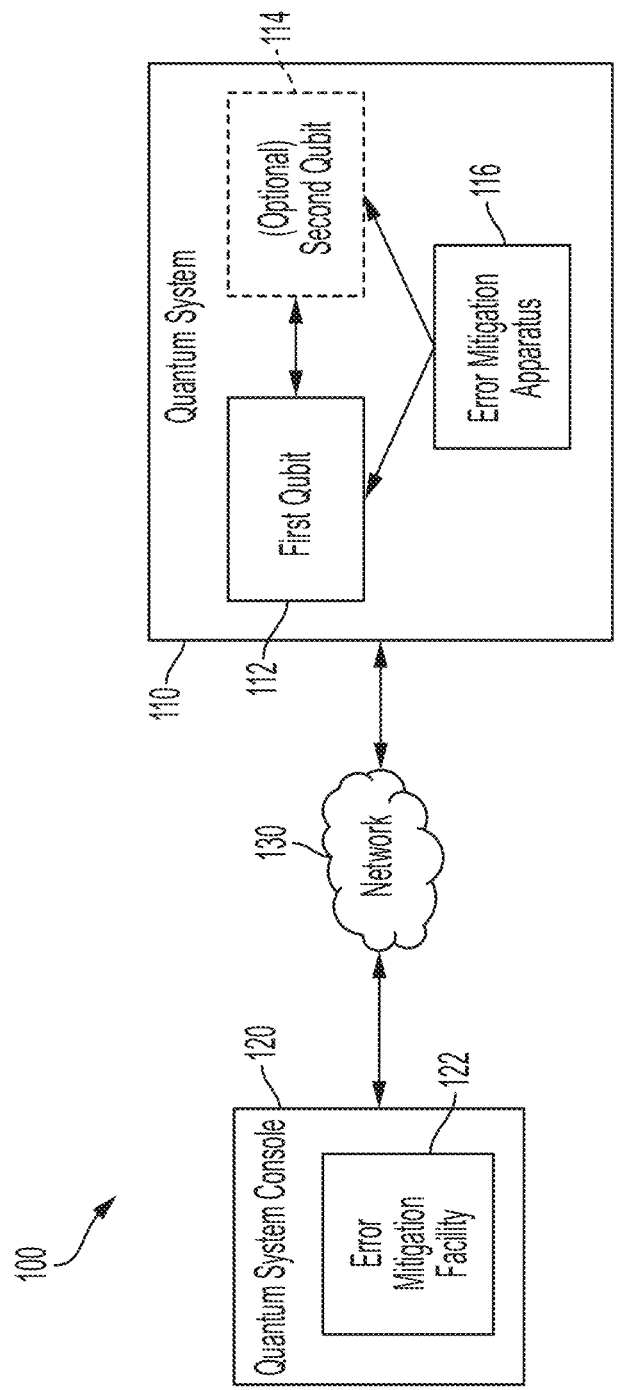
FIG. 1 is a schematic diagram of a facility for performing quantum error mitigation using quantum measurement emulation techniques, in accordance with some embodiments described herein.

Described herein are systems and methods for performing open-loop quantum error mitigation using quantum measurement emulations. Such quantum measurement emulations can be implemented by stochastically applying a quantum gate to a quantum bit ("qubit") or set of qubits during the implementation of a quantum algorithm. The act of stochastically applying the quantum gate can reduce the trace distance between the qubit state and a desired qubit state by projecting the qubit state onto an axis of the Bloch sphere. Because quantum measurement emulations are open-loop in nature, their implementation does not involve performing readout measurements or state tomography and takes less time and fewer qubits to implement than conventional closed-loop quantum error correction techniques.

Large scale, commercial quantum computation is currently limited by sources of noise that can cause errors in stored data or computations over time. Such errors restrict the functional length of quantum algorithms by limiting the number of quantum gates that may be applied before an error in the computation occurs. As a result, such limitations can reduce the usefulness of quantum algorithms that can be executed by limiting the available computational complexity that can be practically implemented.

To enable fault-tolerant quantum computing, closed-loop quantum error correction codes have been developed. Such closed-loop quantum error correction codes are largely similar to classical error correction codes as discussed above, with two important differences: (1) directly measuring the value of qubits affects their value, and (2) qubits are subject to additional kinds of errors not experienced by classical bits. To avoid performing direct measurements of data qubits, ancilla qubits can be used to perform stabilizer measurements that reveal relational information between data qubits without affecting the information they store. However, the use of ancilla qubits increases the number of required qubits to perform a computation and reduces hardware efficiency.

Qubit errors can be described as either coherent errors or incoherent errors; coherent errors lead to a deterministically incorrect state, and incoherent errors lead to a probabilistic loss of information. Of these, coherent errors provide a higher barrier to fault-tolerance and can compound upon each other in unexpected ways. To address these more complex error types, more physical qubits are needed to form a robust logical qubit that is less vulnerable to bit error noise because of increased bit redundancy.

Such closed-loop quantum error correction codes suffer from additional disadvantages. For example, stabilizer measurements are associated with larger error rates that are almost an order of magnitude higher than the error rates associated with application of quantum logic gates. Stabilizer measurements also suffer from information decay during these long measurement operations. The logic for decoding measured errors is much slower than performing a quantum gate operation, and during that decoding time incoherent errors accrue and information is lost from the qubit. Because of the high error rate associated with quantum state measurement and the additional time required for performing such measurements, using a closed-loop quantum error correction code in a way that shows improved performance over conventional physical qubit systems has not yet been demonstrated for most qubit modalities.

The inventors have recognized that open-loop quantum error correction codes can mitigate and/or correct errors in stored quantum information without presenting the same disadvantages as closed-loop quantum error correction codes. In contrast to closed-loop quantum error correction codes, open-loop quantum error correction methods do not include performing stabilizer measurements on the data qubits. The elimination of such stabilizer measurements can reduce time spent performing error correction techniques, reduce errors caused by decoherence, and reduce overall computing time.

The inventors have recognized and appreciated that the act of measuring a qubit and forgetting the value affects the qubit state in a way that mitigates errors and may be simulated by stochastically applying a quantum gate. Such quantum measurement emulations (QMEs) can produce similar results as closed-loop measurement techniques without introducing additional ancilla qubits or time delays associated with measurement and/or readout. Accordingly, the inventors have developed systems and methods for performing error suppression using stabilizer codes in the absence of feedback or measurement of the data qubit states. The act of measuring the expectation value of a stabilizer S and forgetting the outcome can be simulated by stochastically applying the quantum gate S with probability of 0.5. After a single application, this quantum measurement emulation can reduce the trace distance between the actual qubit state and the ideal qubit state. Multiple applications of the quantum measurement emulation throughout the course of an algorithm can improve the algorithm fidelity for large circuit depths.

Some embodiments are directed to a system including a first qubit and an apparatus coupled to the first qubit. The first qubit may be any suitable qubit configured to store information in a quantum state, and it is to be appreciated that the techniques described herein may be implemented in any quantum system, regardless of the underlying hardware that is used to implement the first qubit. As a non-limiting example, the first qubit may be a superconducting qubit, a semiconductor qubit, a trapped ion qubit, or a nitrogen-vacancy (NV) center qubit. The apparatus may be configured to alter a state of the first qubit. For example, if the first qubit comprises a superconducting or semiconductor qubit, the apparatus may be configured to apply a microwave signal to the first qubit to alter a state of the first qubit. Alternatively, if the qubit comprises a trapped ion qubit or an NV center qubit, the apparatus may be configured to apply an optical signal to the first qubit to alter a state of the first qubit.

In some embodiments, the apparatus may be configured to stochastically (e.g., probabilistically) apply a quantum gate to the first qubit. The quantum gate may be configured to perform a rotation of $\pi$ radians around an axis of the Bloch sphere. Stochastically applying the quantum gate may reduce a trace distance between the actual state of the first qubit and a desired state (e.g., the data state) of the first qubit by simulating a measurement of the quantum state of the qubit. The apparatus may be configured to stochastically apply a quantum gate to the first qubit after the system applies an arbitrary quantum gate to the first qubit (e.g., after the system performs an arbitrary computational operation). The apparatus may be configured to stochastically apply the quantum gate to the first qubit with a probability of 0.5.

Some embodiments are directed to a method of performing open-loop quantum error mitigation. The method includes stochastically determining whether to apply a quantum gate to a first qubit. The determination may be made, for example, using a random number generator in order to make the application of the quantum gate probabilistic in nature rather than deterministic. In some embodiments, the determination may be made with a probability of 0.5.

In response to stochastically determining to apply the quantum gate, the quantum gate may be applied to the first qubit using any suitable apparatus. The quantum gate may be configured to perform a rotation of $\pi$ radians around an axis of the Bloch sphere. For example, the quantum gate may be a Pauli-X gate ("X gate") configured to perform a rotation of $\pi$ radians around the x-axis of the Bloch sphere. As additional examples, the quantum gate may be a Pauli-Y gate ("Y gate") or a Pauli-Z gate ("Z gate") configured to perform a rotation of $\pi$ radians around the y-axis and the z-axis, respectively, of the Bloch sphere. Alternatively, the quantum gate may be a Hadamard gate ("H gate") configured to perform a rotation of $\pi$ radians around the axis $(\hat{x}+\hat{z})/\sqrt{2}$ of the Bloch sphere. It may be appreciated that the quantum gate may be configured to perform a rotation of $\pi$ radians about any arbitrary axis of the Bloch sphere (e.g., the quantum gate may be a member of the group SU(n), where n is the number of physical qubits).

Following below are more detailed descriptions of various concepts related to, and embodiments of, techniques for implementing quantum error mitigation using quantum measurement emulations. It should be appreciated that various aspects described herein may be implemented in any of numerous ways. Examples of specific implementations are provided herein for illustrative purposes only. In addition, the various aspects described in the embodiments below may be used alone or in any combination and are not limited to the combinations explicitly described herein.

FIG. 1 is a schematic diagram of a facility for performing quantum information processes, in accordance with some embodiments described herein. In the illustrative example of FIG. 1, facility 100 includes a quantum system 110 and a quantum system console 120. It should be appreciated that facility 100 is illustrative and that a facility may have one or more other components of any suitable type in addition to or instead of the components illustrated in FIG. 1. For example, there may be additional qubits or additional quantum components (e.g., readout components) present within a facility.

As illustrated in FIG. 1, in some embodiments, the quantum system 110 and the quantum system console 120 may be communicatively connected by a network 130. The network 130 may be or include one or more local- and/or wide-area, wired and/or wireless networks, including a local-area or wide-area enterprise network and/or the Internet. Accordingly, the network 130 may be, for example, a hard-wired network (e.g., a local area network within a facility), a wireless network (e.g., connected over Wi-Fi and/or cellular networks), a cloud-based computing network, or any combination thereof. For example, in some embodiments, the quantum system 110 and the quantum system console 120 may be located within a same facility and connected directly to each other or connected to each other via the network 130.

In some embodiments, the quantum system console 120 may be configured to send information to and/or receive information from one or more components within the quantum system 110 (e.g., error mitigation apparatus 116). The quantum system 110 may include a first qubit 112, optionally a second qubit 114 coupled to the first qubit 112, and an error mitigation apparatus 116. The error mitigation apparatus 116 may be configured to stochastically apply a quantum gate to first and/or second qubits 112 and 114 during a quantum computational process performed by quantum system 110. It is to be appreciated that the exemplary quantum system 110 of FIG. 1 is illustrative in nature and may, in some embodiments, include any suitable number of qubits, including hundreds or thousands of qubits.

First qubit 112 and optional second qubit 114 may be any suitable qubit configured to store quantum information in a quantum state. In some embodiments, first qubit 112 and optional second qubit 114 may be superconducting qubits. Alternatively, first qubit 112 and optional second qubit 114 may be any suitable qubit configured to store quantum information. As a non-limiting example, first qubit 112 and optional second qubit 114 may additionally be semiconductor qubits, trapped ion qubits, NV center qubits, or any other suitable qubit hardware implementation.

In some embodiments, the error mitigation apparatus 116 may be coupled to the first qubit 112 and optional second qubit 114. The error mitigation apparatus 116 may be configured to alter a quantum state of the first qubit 112 and/or optional second qubit 114 by applying a quantum gate. For example, in some embodiments where first qubit 112 and optional second qubit 114 comprise superconducting or semiconductor qubits, the error mitigation apparatus 116 may be configured to apply one or more microwave signals to first qubit 112 and optional second qubit 114 in order to alter a state of the first qubit 112 and the optional second qubit 114. Alternatively, in some embodiments where first qubit 112 and optional second qubit 114 comprise trapped ion qubits or NV center qubits, error mitigation apparatus 116 may be configured to apply one or more optical signals to first qubit 112 and optional second qubit 114 in order to alter a state of the first qubit 112 and the optional second qubit 114.

In some embodiments, the error mitigation apparatus 116 may be configured to stochastically apply a quantum gate to the first qubit 112 and the optional second qubit 114. In some embodiments, the stochastic application of the quantum gate to the first qubit 112 and the optional second qubit 114 may be simultaneous. Stochastically applying the quantum gate may mitigate errors in the quantum information stored in the first qubit 112 and optional second qubit 114 by simulating the effects of a quantum measurement. In some embodiments, the error mitigation apparatus 116 may be configured to stochastically apply a quantum gate with a probability of 0.5 (e.g., having a 50% probability of applying the gate and a 50% chance of applying the identity).

In some embodiments, the quantum gate may be configured to cause a rotation of $\pi$ radians of the quantum state of the first qubit 112 and the optional second qubit 114 around an axis of the Bloch sphere. For example, the quantum gate may be a Pauli-X gate ("X gate") configured to perform a rotation of $\pi$ radians around the x-axis of the Bloch sphere. As additional examples, the quantum gate may be a Pauli-Y gate ("Y gate") or a Pauli-Z gate ("Z gate") configured to perform a rotation of $\pi$ radians around the y-axis and the z-axis, respectively, of the Bloch sphere. Alternatively, the quantum gate may be a Hadamard gate ("H gate") configured to perform a rotation of $\pi$ radians around the axis $(\hat{x}+\hat{z})/\sqrt{2}$ of the Bloch sphere. It may be appreciated that the quantum gate may be configured to perform a rotation of $\pi$ radians about any arbitrary axis of the Bloch sphere (e.g., the quantum gate may be a member of the group SU(n), where n is the number of physical qubits).

In some embodiments, the error mitigation apparatus 116 may stochastically apply the quantum gate in response to a signal stochastically generated by external controller (e.g., from quantum system console 120) configured to stochastically determine whether to send the signal to the error mitigation apparatus 116. The controller may stochastically determine whether to send the signal by using, for example, a random number generator or any other suitable source of entropy.

As illustrated in FIG. 1, facility 100 includes quantum system console 120 communicatively coupled to the quantum system 110. Quantum system console 120 may be any suitable electronic device configured to send instructions and/or information to quantum system 110, to receive information from quantum system 110, and/or to process obtained quantum states (e.g., obtained through a measurement component coupled to the first qubit 112 and optional second qubit 114, not shown herein). In some embodiments, quantum system console 120 may be a fixed electronic device such as a desktop computer, a rack-mounted computer, or any other suitable fixed electronic device. Alternatively, quantum system console 120 may be a portable device such as a laptop computer, a smart phone, a tablet computer, or any other portable device that may be configured to send instructions and/or information to quantum system 110, to receive information from quantum system 110, and/or to process obtained quantum information from quantum system 110.

Some embodiments may include an error mitigation facility 122 stored on quantum system console 120. Error mitigation facility 122 may be configured to stochastically determine whether to apply a quantum gate to first qubit 112 and optional second qubit 114 during a quantum computation process (e.g., periodically throughout a quantum computation process, after each gate of a quantum computation process, at irregular intervals throughout the quantum computation process, etc.). After stochastically determining to apply the quantum gate, error mitigation facility 122 may send a signal to error mitigation apparatus 116 that causes error mitigation apparatus 116 to apply the quantum gate to first qubit 112 and optional second qubit 114. After stochastically determining not to apply the quantum gate, error mitigation facility 122 may send a signal to error mitigation apparatus 116 that causes error mitigation apparatus 116 to apply an identity function to first qubit 112 and optional second qubit 114. Alternatively, after stochastically determining not to apply the quantum gate, error mitigation facility 122 may send no signal to error mitigation apparatus 116.

In some embodiments, error mitigation facility 122 may be configured to stochastically determine whether to apply the quantum gate using a classical entropy source. For example, error mitigation facility 122 may use an output of a random number generator to stochastically determine whether to apply the quantum gate, though it is to be appreciated that any suitable entropy source may be employed. In some embodiments, error mitigation facility 122 may be configured to stochastically determine whether to apply the quantum gate with a probability of 0.5.

Figure 2:
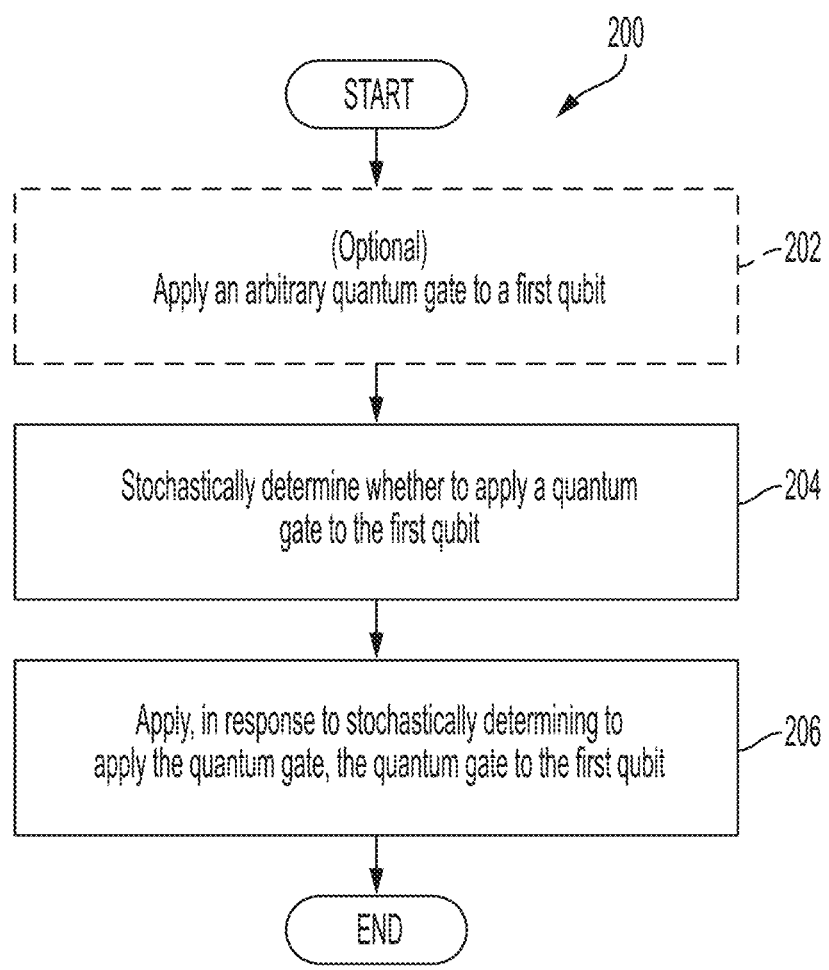
FIG. 2 is a flowchart of an illustrative process 200 of performing quantum error mitigation using quantum measurement emulation techniques, in accordance with some embodiments described herein.

FIG. 2 is a flowchart of an illustrative process 200 of performing quantum error mitigation using quantum measurement emulation techniques, in accordance with some embodiments described herein. Process 200 may be implemented by an error mitigation facility, such as the facility 122 of FIG. 1. As such, in some embodiments, the process 200 may be performed by a computing device configured to send instructions to a quantum system and/or to receive information from a quantum system (e.g., quantum system console 120 executing error mitigation facility 122 as described in connection with FIG. 1). As another example, in some embodiments, the process 200 may be performed by one or more processors located remotely (e.g., as part of a cloud computing environment, as connected through a network) from the quantum system.

Process 200 may begin optionally at act 202, where the quantum system may apply an arbitrary quantum gate to a first qubit. In some embodiments, the arbitrary quantum gate may be any suitable quantum gate configured to act upon a state of the first qubit. The arbitrary quantum gate may be, as a non-limiting example, a √NOT gate, a phase shift gate, a SWAP gate, a √SWAP gate, a CNOT gate, a Toffoli gate, a Fredkin gate, an Ising coupling gate, a Deutsch gate, or any other suitable quantum gate. The arbitrary quantum gate may be a part of a larger quantum algorithm (e.g., an algorithm comprising many quantum gates configured to perform a quantum computation).

After optionally completing act 202, process 200 may proceed to act 204, where the error mitigation facility and/or the error mitigation apparatus may stochastically determine whether to apply a quantum gate to the first qubit. The error mitigation facility may stochastically determine whether to apply the quantum gate with a probability of 0.5 (e.g., equal probabilities of determining to apply the quantum gate and determining to not apply the quantum gate and/or to apply the identity after applying the arbitrary quantum gate). The error mitigation facility may use, for example, a random number generator or any other suitable source of entropy to perform the stochastic determination of act 204.

After completing act 204, process 200 may proceed to act 206, where the error mitigation apparatus may, in response to the stochastic determination to apply the quantum gate, apply the quantum gate to the first qubit. In some embodiments, the error mitigation apparatus may apply the quantum gate in response to a signal received from the error mitigation facility. In other embodiments, the error mitigation apparatus may perform the stochastic determination itself (e.g., using an on-board processor) and may apply the quantum gate in response to its own stochastic determination.

In some embodiments, the quantum gate may be configured to perform a rotation of the state of the first qubit of $\pi$ radians around an axis of the Bloch sphere. For example, the quantum gate may be a Pauli-X gate ("X gate") configured to perform a rotation of $\pi$ radians around the x-axis of the Bloch sphere. As additional examples, the quantum gate may be a Pauli-Y gate ("Y gate") or a Pauli-Z gate ("sZ gate") configured to perform a rotation of $\pi$ radians around the y-axis and the z-axis, respectively, of the Bloch sphere. Alternatively, the quantum gate may be a Hadamard gate ("H gate") CONFIGURED TO PERFORM A ROTATION OF $\pi$ RADIANS AROUND THE AXIS $(\hat{X}+\hat{Z})/\sqrt{2}$ OF THE BLOCH sphere. It may be appreciated that the quantum gate may be configured to perform a rotation of $\pi$ radians about any arbitrary axis of the Bloch sphere (e.g., the quantum gate may be a member of the group SU(n), where n is the number of qubits).

In some embodiments, the error mitigation apparatus may apply the quantum gate by applying a suitable stimulus signal to the first qubit. For example, the error mitigation apparatus may be configured to apply a microwave signal to the first qubit in order to apply the quantum gate. Alternatively, the error mitigation apparatus may be configured to apply an optical signal to the first qubit in order to apply the quantum gate.

Figure 3:
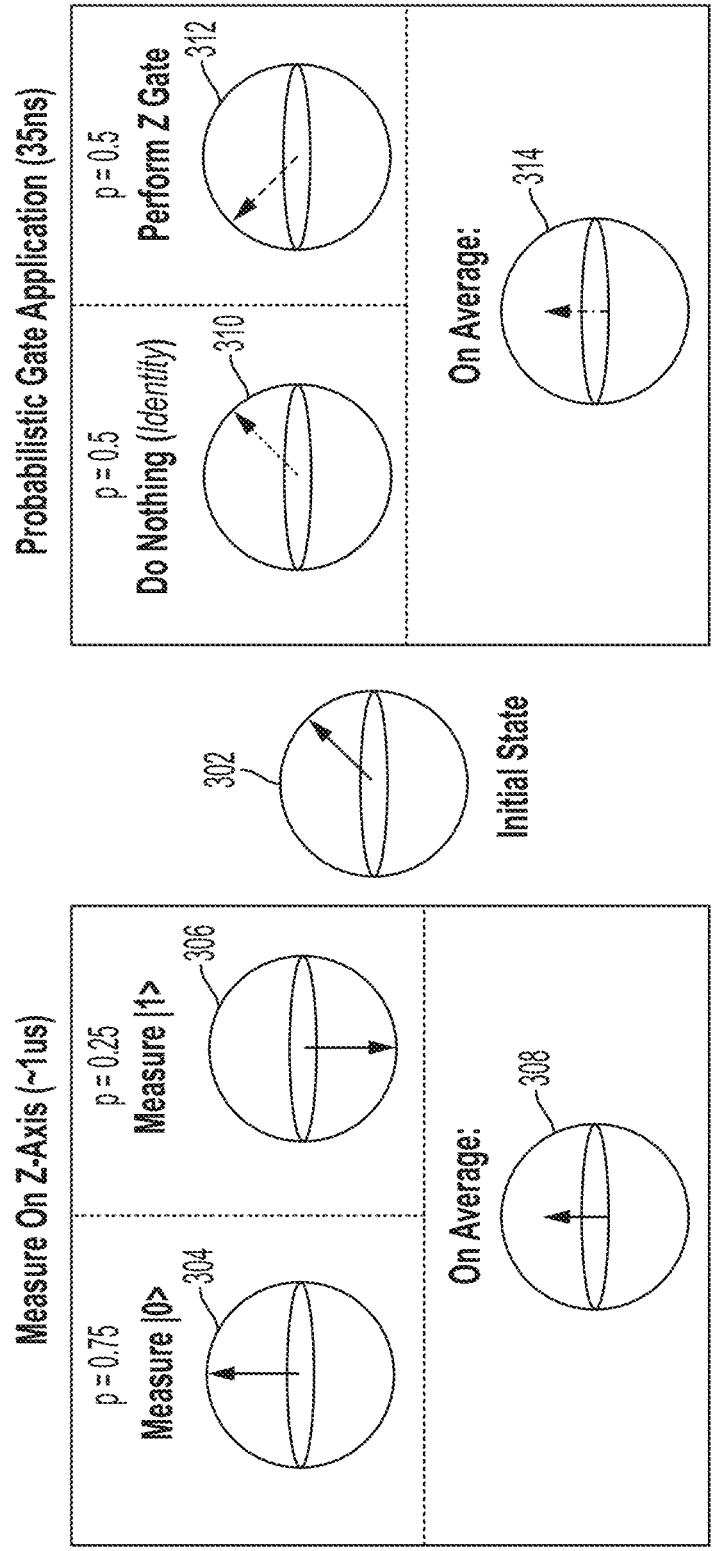
FIG. 3 is an illustrative example of the effects on a qubit state of performing a different quantum error mitigation schemes including quantum measurement emulation, in accordance with some embodiments described herein.

FIG. 3 is an example illustrating the effects of quantum measurement emulations implemented using stochastic application of a quantum gate, in accordance with some embodiments described herein. For a given initial state 302 of a qubit, shown herein with reference to the Bloch sphere, the effects of a measurement along the Z-axis of the qubit state are shown at left in the illustrative example of FIG. 3. Per the Heisenberg uncertainty principle, a measurement of a quantum state composed of superposed quantum states will collapse the quantum state into one of the superposed states. For the illustrative initial state 302, the measured state could be collapsed either into measured state 304, indicating a $|0\rangle$ state, with a probability of 0.75, or into measured state 306, indicating a $|1\rangle$, with a probability of 0.25. The average of these measurements, if performed repeatedly, is shown in the example of FIG. 3 as state 308, directed along the positive z-axis with a magnitude less than one. The density operator after the state tomography measurement, denoted $\rho'$, may be described as a sum of the Kraus operators acting on the density operator of the initial state, $\rho$, such that $$\rho' = |0\rangle\langle 0|\rho|0\rangle\langle 0| + |1\rangle\langle 1|\rho|1\rangle\langle 1|$$

or:

$$\rho' = \begin{bmatrix} \rho_{00} & 0 \\ 0 & \rho_{11} \end{bmatrix}.$$

The right panel of the example of FIG. 3 illustrates the effects of stochastically applying a quantum gate configured to perform a rotation of $\pi$ radians around the z-axis, in accordance with some embodiments described herein. For the given initial state 302 of the qubit, stochastic gate application may yield the identity state 310 with a probability of 0.5 or the post-gate state 312 with a probability of 0.5. If the quantum gate is stochastically applied repeatedly, the average of these states is shown as state 314. It may be appreciated that the average state 314 is pictorially identical to the state 308 of the tomography example. Mathematically, the density operator after the quantum measurement emulation, denoted $\rho''$, may be described as $$\rho'' = \frac{\mathbb{1}\rho\mathbb{1} + \sigma_z\rho\sigma_z}{2}$$

where $\mathbb{1}$ is the identity and $\sigma_z$ is the Z gate. This provides:

$$\rho'' = \begin{bmatrix} \rho_{00} & 0 \\ 0 & \rho_{11} \end{bmatrix} = \rho'.$$

Additionally, it may further be appreciated that performing such state measurements takes, for a superconducting qubit system, approximately 1 microsecond while probabilistic gate application takes approximately 35 nanoseconds while yielding the same average result. Analogously, for a trapped ion qubit system, a measurement may take approximately 200 microseconds while the application of a single qubit gate may take approximately 1 microsecond.

Figure 4A:
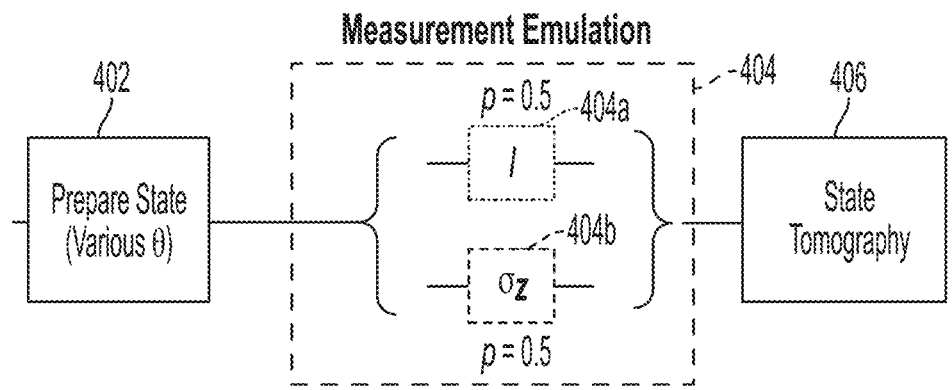
FIG. 4A is a schematic diagram of a quantum circuit including a quantum measurement emulation implemented using a stochastically-applied Z gate, in accordance with some embodiments described herein.

FIG. 4A is a schematic diagram of a quantum circuit including a quantum measurement emulation composed of a stochastically-applied Z gate, in accordance with some embodiments described herein. The quantum circuit includes a first qubit, whose state is prepared by any suitable method at state preparation 402. The state of the first qubit may be along any suitable axis. To perform error mitigation, a quantum measurement emulation 404 may be performed. The quantum measurement emulation includes the stochastic application of either the identity 404a or the Z gate 404b, each having a probability of 0.5 of being applied to the first qubit. After the quantum measurement emulation 404 is performed, a state tomography 406 may be performed to assess the effects of the quantum measurement emulation 404.

Figure 4B:
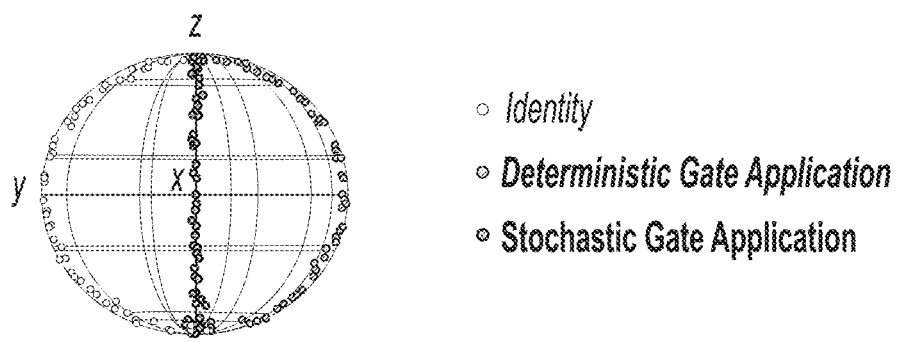
FIG. 4B is a depiction of the Bloch sphere and measured states of a qubit after performing identity operations, deterministic Z gate operations, and stochastic Z gate operations, as described in connection with FIG. 4A, in accordance with some embodiments described herein.

FIG. 4B is a depiction of the Bloch sphere and measured states of a first qubit after performance of identity operations, deterministic Z gate operations, and stochastic Z gate operations as performed by the quantum circuit of FIG. 4A, in accordance with some embodiments described herein. The Bloch sphere is a geometrical representation of the pure state space of a two-level qubit (e.g., a qubit configured to represent the states |0⟩ and |1⟩). As can be seen from the example of FIG. 4B, always applying the identity matrix (e.g., leaving the qubit state unchanged) after preparing the qubit state (e.g., in place of quantum measurement emulation 404 of FIG. 4A) allows the qubit state to drift away from the z-axis. Similarly, deterministically applying (e.g., always applying; applying with a known periodicity) the Z gate after preparing the qubit state allows the qubit state to drift away from the z-axis in an opposing direction as the identity matrix. The stochastic application of the Z gate (e.g., in quantum measurement emulation 404 of FIG. 4A) causes the qubit state to remain along the z-axis and closer to a desired state (e.g., with a reduced error).

Figure 5A:
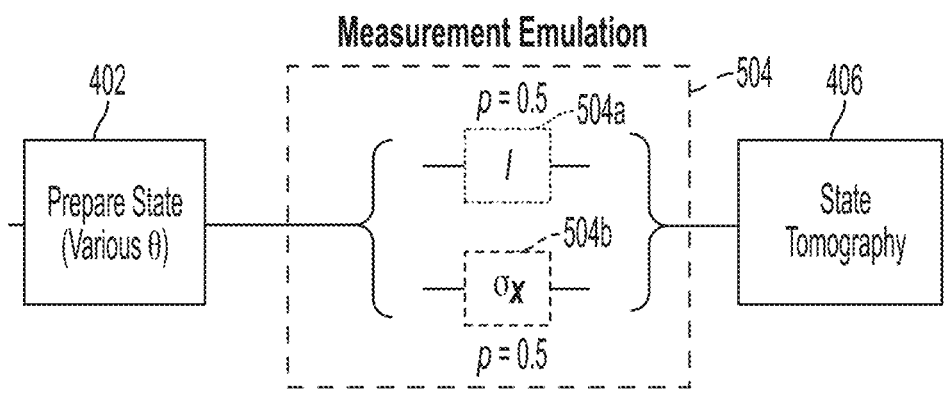
FIG. 5A is a schematic diagram of a quantum circuit including a quantum measurement emulation implemented using a stochastically-applied X gate, in accordance with some embodiments described herein.

Similar effects can be seen for the X gate and the H gate. FIG. 5A is a schematic diagram of a quantum circuit including a stochastically-applied X gate, in accordance with some embodiments described herein. The quantum circuit includes a first qubit, whose state is prepared by any suitable method at state preparation 402. The state of the first qubit may be along any suitable axis. To perform error mitigation, a quantum measurement emulation 504 may be performed. The quantum measurement emulation includes the stochastic application of either the identity 504a or the X gate 504b, each having a probability of 0.5 of being applied to the first qubit. After the quantum measurement emulation 504 is performed, a state tomography 406 may be performed to determine the state of the qubit and assess the effects of the quantum measurement emulation 504.

Figure 5B:
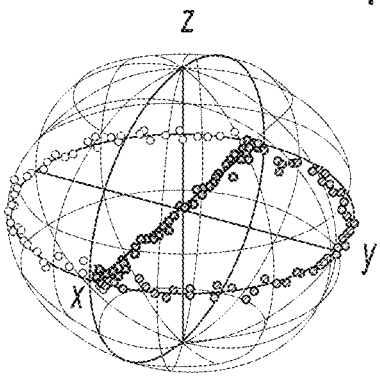
FIG. 5B is a depiction of the Bloch sphere and measured states of a qubit after performing identity operations, deterministic X gate operations, and stochastic X gate operations, as described in connection with FIG. 5A, in accordance with some embodiments described herein.

FIG. 5B is a depiction of the Bloch sphere and measured states of a qubit after performance of identity operations, deterministic X gate operations, and stochastic X gate operations as performed by the quantum circuit of FIG. 5A, in accordance with some embodiments described herein. As can be seen from the example of FIG. 5B, always applying the identity matrix (e.g., leaving the qubit state unchanged) after preparing the qubit state (e.g., in place of quantum measurement emulation 504 of FIG. 5A) allows the qubit state to drift away from the x-axis. Similarly, deterministically applying (e.g., always applying; applying with a known periodicity) the X gate after preparing the qubit state allows the qubit state to drift away from the x-axis in an opposing direction as the identity matrix allows. The stochastic application of the X gate (e.g., in quantum measurement emulation 504 of FIG. 5A) causes the qubit state to remain along the x-axis and closer to a desired state (e.g., with a reduced error).

Figure 6A:
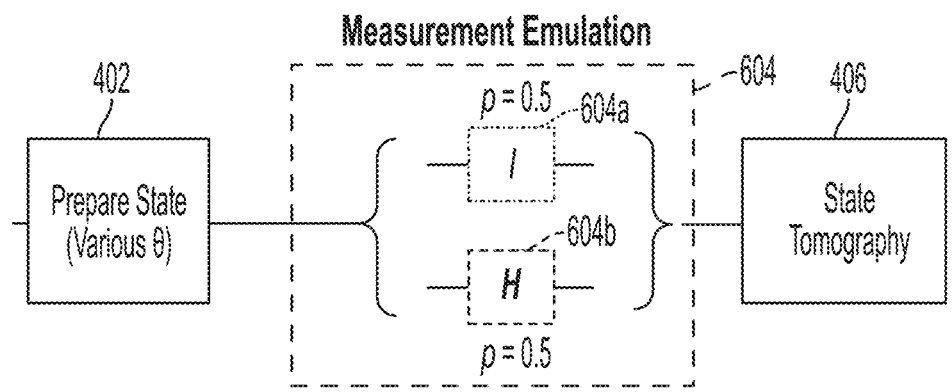
FIG. 6A is a schematic diagram of a quantum circuit including a quantum measurement emulation implemented using a stochastically-applied Hadamard gate, in accordance with some embodiments described herein.

FIG. 6A is a schematic diagram of a quantum circuit including a stochastically-applied Hadamard gate, in accordance with some embodiments described herein. The Hadamard gate may be configured to perform a rotation of $\pi$ radians around the axis $(\hat{x}+\vec{z})/\sqrt{2}$ of the Bloch sphere. The quantum circuit includes a first qubit, whose state is prepared by any suitable method at state preparation 402. The state of the first qubit may be along any suitable axis. To perform error mitigation, a quantum measurement emulation 604 may be performed. The quantum measurement emulation includes the stochastic application of either the identity 604a or the H gate 604b, each having a probability of 0.5 of being applied to the first qubit. After the quantum measurement emulation 604 is performed, a state tomography 406 may be performed to assess the effects of the quantum measurement emulation 604.

Figure 6B:
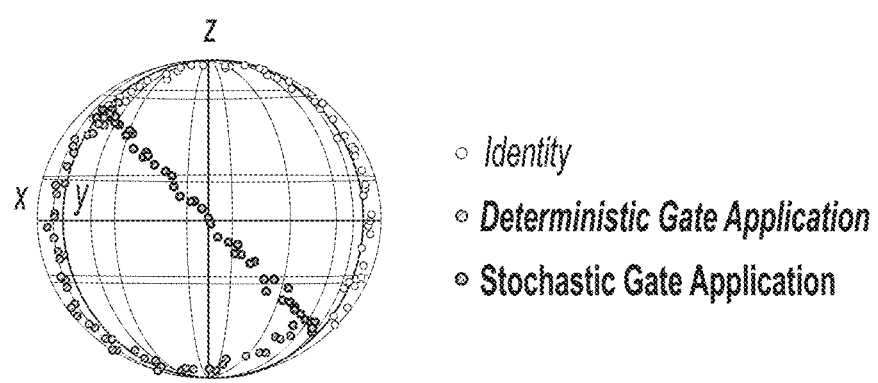
FIG. 6B is a depiction of the Bloch sphere and measured states of a qubit after performing identity operations, deterministic Hadamard gate operations, and stochastic Hadamard gate operations, as described in connection with FIG. 6A, in accordance with some embodiments described herein.

FIG. 6B is a depiction of the Bloch sphere and measured states of a qubit after performing identity operations, deterministic Hadamard gate operations, and stochastic Hadamard gate operations as performed by the quantum circuit of FIG. 6A, in accordance with some embodiments described herein. As can be seen from the example of FIG. 6B, always applying the identity matrix (e.g., leaving the qubit state unchanged) after preparing the qubit state (e.g., in place of quantum measurement emulation 604 of FIG. 6A) allows the qubit state to drift away from the Hadamard-axis. Similarly, deterministically applying (e.g., always applying; applying with a known periodicity) the H gate after preparing the qubit state allows the qubit state to drift away from the Hadamard-axis in an opposing direction as the identity matrix allows. The stochastic application of the H gate (e.g., in quantum measurement emulation 604 of FIG. 6A) causes the qubit state to remain along the Hadamard-axis and closer to a desired state (e.g., with a reduced error).

Figure 7A:
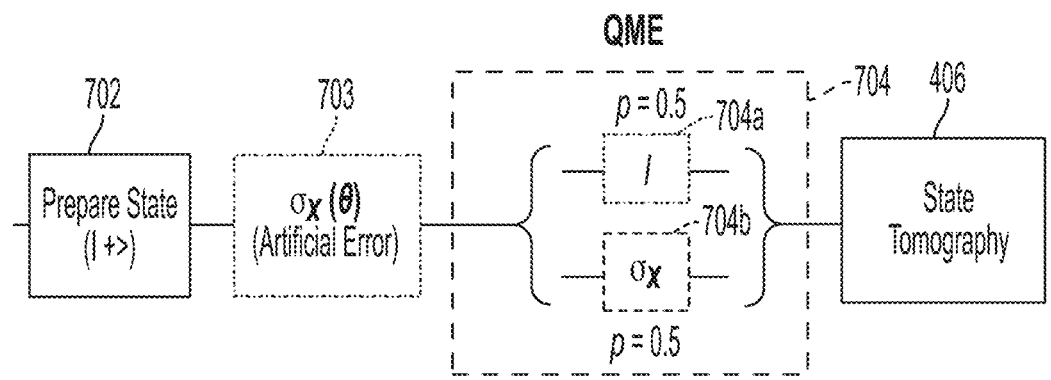
FIG. 7A is a schematic diagram of a quantum circuit including an introduced artificial error and a quantum measurement emulation implemented using a stochastically-applied X gate, in accordance with some embodiments described herein.

FIG. 7A is a schematic diagram of a quantum circuit including a source of artificial error and a quantum measurement emulation, in accordance with some embodiments described herein. The quantum circuit includes a first qubit, whose state is prepared by any suitable method at state preparation 702. In the example of FIG. 7A, the state of the qubit may be prepared along the x-axis and to store a bit in the |1⟩ state. To analyze the error mitigation abilities of a quantum measurement emulation, an artificial error 703 may be applied. For example, the artificial error 703 may be a $\sigma_x(\theta)$ gate, which may shift the state of the qubit off of the x-axis. To perform error mitigation, a quantum measurement emulation 704 may be performed. The quantum measurement emulation includes the stochastic application of either the identity 704a or the X gate 704b, each having a probability of 0.5 of being applied to the first qubit. After the quantum measurement emulation 704 is performed, a state tomography 406 may be performed to assess the effects of the quantum measurement emulation 704 on the introduced artificial error 703.

Figure 7B:
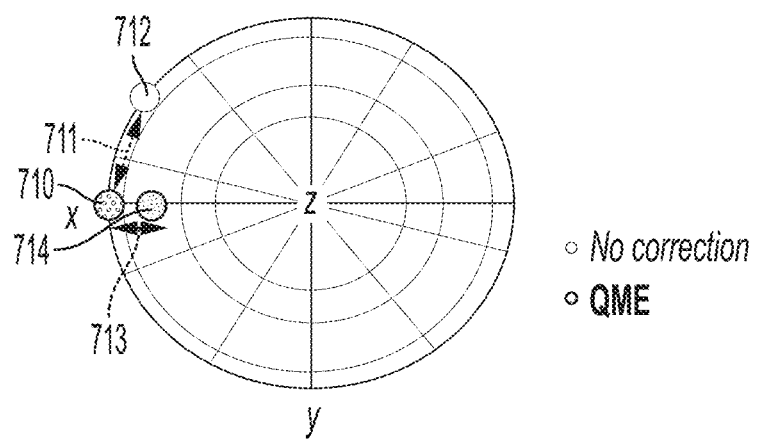
FIG. 7B is a depiction of the Bloch sphere and trace distances between a desired quantum state and a quantum state after (1) applying no error mitigation and (2) applying a quantum measurement emulation, as described in connection with FIG. 7A, in accordance with some embodiments described herein.

FIG. 7B is a depiction of the Bloch sphere and trace distances between the desired quantum state and quantum states after application of an artificial error with (1) no error mitigation procedure applied and (2) after a quantum measurement emulation, in accordance with some embodiments described herein. The desired quantum state 710 may be the ideal |1⟩ state prepared by state preparation 702 of the quantum circuit of FIG. 7A. After application of the artificial error 703 in the example of FIG. 7A, the actual quantum state may be shifted off the x-axis to state 712. By including a quantum measurement emulation 704 in the quantum circuit, the state 712 may be projected back onto the x-axis of the Bloch sphere, producing state 714. As may be appreciated from FIG. 7B, the trace distance 711 between state 710 and state 712 is larger in magnitude than the trace distance 713 between state 710 and state 714, indicating that the quantum measurement emulation 704 can reduce the magnitude of induced errors in the quantum state.

Figure 7C:
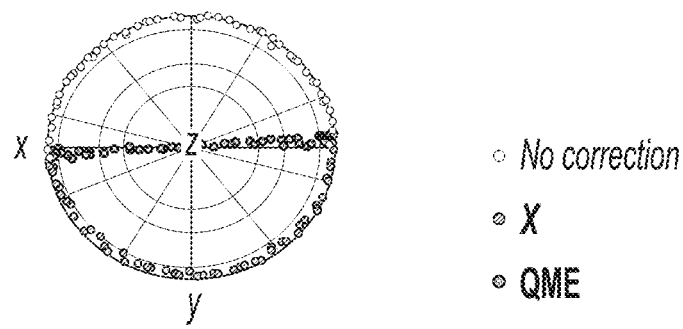
FIG. 7C is a depiction of the Bloch sphere and measured states of a qubit after performing no error mitigation, after deterministically applying an X gate, and after performing quantum measurement emulations by stochastically applying an X gate, in accordance with some embodiments described herein.

FIG. 7C is a depiction of the Bloch sphere and measured states of a qubit after application of various artificial errors to a prepared quantum state as described in connection with the quantum circuit of FIG. 7A, in accordance with some embodiments described herein. FIG. 7C shows the divergence of the measured qubit state away from the x-axis for a qubit where either no error mitigation was performed or deterministic application of the X gate was performed after introduction of the artificial error. FIG. 7C further shows that the stochastic application of the X gate as a quantum measurement emulation keeps the qubit state along the x-axis.

Figure 7D:
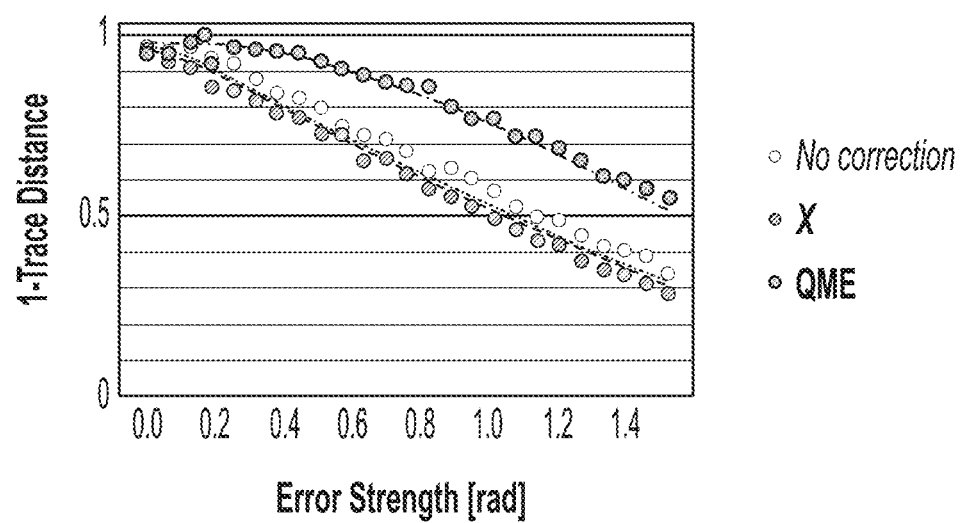
FIG. 7D is a plot, for the data of FIG. 7C, showing a relationship between trace distances between a desired quantum state and measured quantum states and error strength after performing no error mitigation, after deterministically applying an X gate, and after performing quantum measurement emulations by stochastically applying an X gate, in accordance with some embodiments described herein.

FIG. 7D is a plot, for the data of FIG. 7C and the quantum circuit of FIG. 7A, showing a relationship between the trace distance and error strength after performing no error mitigation, after deterministically applying an X gate, and after stochastically applying an X gate to perform quantum measurement emulations, in accordance with some embodiments described herein. For clarity, the values plotted on the y-axis of FIG. 7D show 1–(trace distance). As can be seen from the plot of FIG. 7D, the qubit state after performance of quantum measurement emulations has, for all error strengths, a reduced trace distance between the qubit state and the desired |1⟩ state prepared by state preparation 702.

Figure 8A:
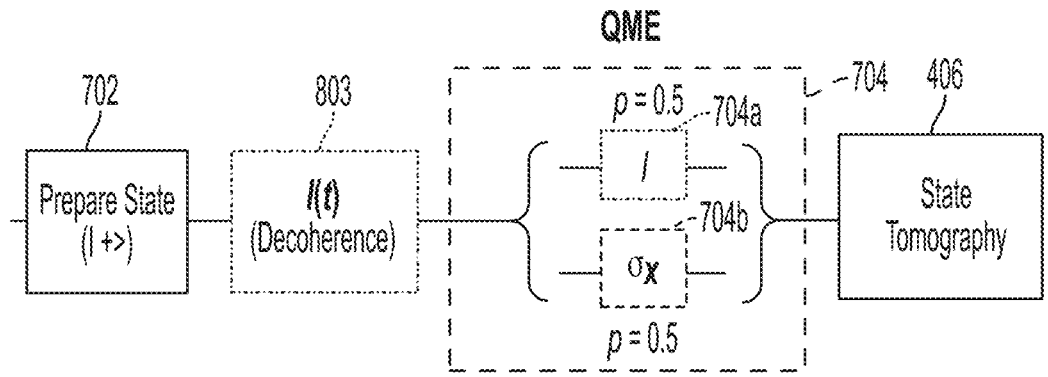
FIG. 8A is a schematic diagram of a quantum circuit including a source of decoherence and a quantum measurement emulation implemented by stochastically applying an X gate, in accordance with some embodiments described herein.

FIG. 8A is a schematic diagram of a quantum circuit including a source of error in the form of decoherence and a quantum measurement emulation, in accordance with some embodiments described herein. The quantum circuit includes a first qubit, whose state is prepared by any suitable method at state preparation 702. In the example of FIG. 8A, the state of the qubit may be prepared along the x-axis and to store a bit in the |1⟩ state. To analyze the error mitigation abilities of the quantum measurement emulation, a source of decoherence 803 may be introduced. For example, the decoherence 803 may simply be a period of time over which the quantum state of the qubit may couple with the environment, reducing a coherence of the quantum state and introducing error. To perform error mitigation and reduce the effects of decoherence on the quantum state of the qubit, a quantum measurement emulation 704 may be performed. The quantum measurement emulation includes the stochastic application of either the identity 704a or the X gate 704b, each having a probability of 0.5 of being applied to the first qubit. After the quantum measurement emulation 704 is performed, a state tomography 406 may be performed to assess the effects of the quantum measurement emulation 704 on the decoherence 803.

Figure 8B:
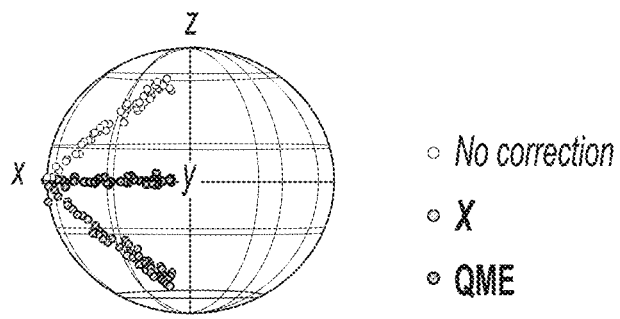
FIG. 8B is a depiction of the Bloch sphere and measured states of a qubit after performing no error mitigations, after deterministically applying an X gate, and after performing quantum measurement emulations by stochastically applying an X gate, in accordance with some embodiments described herein.

FIG. 8B is a depiction of the Bloch sphere and measured states of a qubit after application of various decoherence errors to a prepared quantum state as described in connection with the quantum circuit of FIG. 8A, in accordance with some embodiments described herein. FIG. 8B shows the divergence of the measured qubit state away from the x-axis for a qubit where either no error mitigation was performed or deterministic application of the X gate was performed after introduction of the artificial error. FIG. 8B further shows that the stochastic application of the X gate as a quantum measurement emulation maintains the qubit state along the x-axis, reducing the effects of decoherence on the quantum state of the qubit.

Figure 8C:
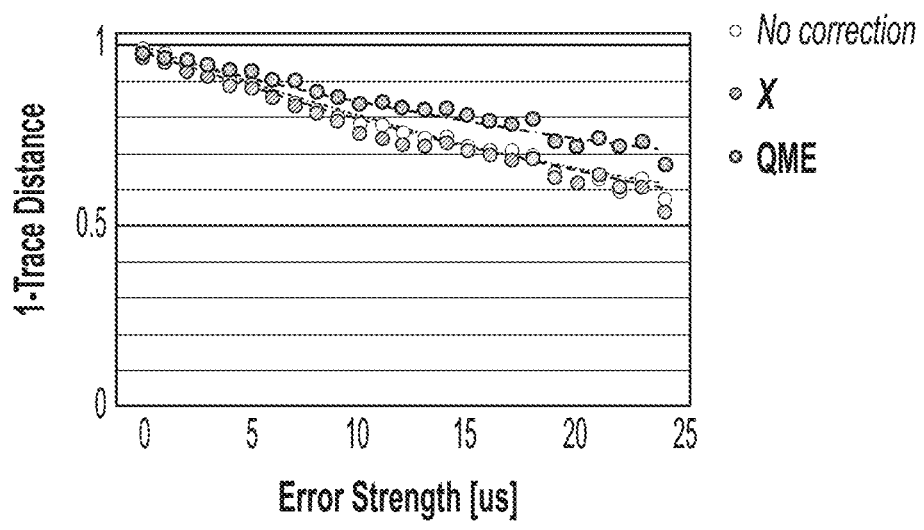
FIG. 8C is a plot, for the data of FIG. 8B, showing a relationship between trace distance between a desired quantum state and measured quantum states and error strength after performing no error mitigation, after deterministically applying an X gate, and after performing quantum measurement emulations by stochastically applying an X gate, in accordance with some embodiments described herein.

FIG. 8C is a plot, for the quantum circuit of FIG. 8A and data of FIG. 8B, showing a relationship between the trace distance and error strength after performing no error mitigation, after deterministically applying an X gate, and after stochastically applying an X gate to perform quantum measurement emulations, in accordance with some embodiments described herein. As in the example of FIG. 7D, the values plotted on the y-axis of FIG. 8C show 1–(trace distance). As can be seen from the plot of FIG. 8C, the qubit state after performance of quantum measurement emulations has, for all error strengths, a reduced trace distance between the qubit state and the desired |1⟩ state prepared by state preparation 702 of FIG. 8A.

Figure 9A:
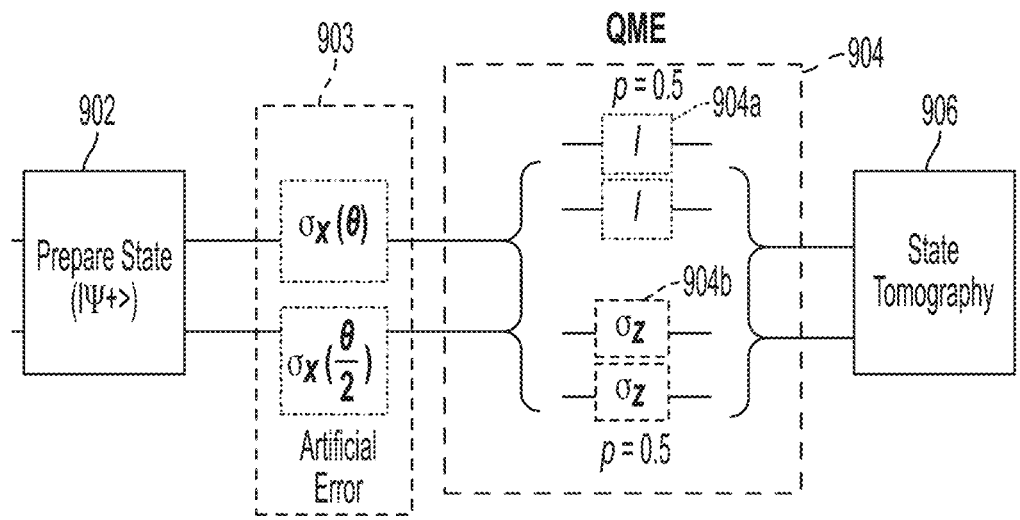
FIG. 9A is a schematic diagram of a quantum circuit including two qubits, a source of artificial errors, and a quantum measurement emulation, in accordance with some embodiments described herein.

FIG. 9A is a schematic diagram of a quantum circuit including two qubits, a source of artificial error, and a quantum measurement emulation applied to the two qubits, in accordance with some embodiments described herein. The quantum circuit includes a first qubit and a second qubit, indicated by the two parallel lines running through the quantum circuit diagram. The states of the first qubit and the second qubit may be prepared by any suitable method at state preparation 902. In the example of FIG. 9A, the states of the qubits may be prepared along the x-axis and to store two bits both in the |1⟩ state. To analyze the error mitigation abilities of a quantum measurement emulation, an artificial error 903 may be applied. For example, the artificial error 903 may be a $\sigma_x(\theta)$ gate applied to the first qubit and a $$\sigma_x\left(\frac{\theta}{2}\right)$$

gate applied to the second qubit. Both gates may shift the state of the qubits off of the x-axis by differing amounts. To perform error mitigation, a quantum measurement emulation 904 may be performed. The quantum measurement emulation includes the stochastic application of either the identity 904a or the X gate 904b, each having a probability of 0.5 of being applied to the first qubit and the second qubit. After the quantum measurement emulation 904 is performed, a state tomography 906 may be performed to assess the effects of the quantum measurement emulation 904 on the introduced artificial error 903.

Figure 9B:
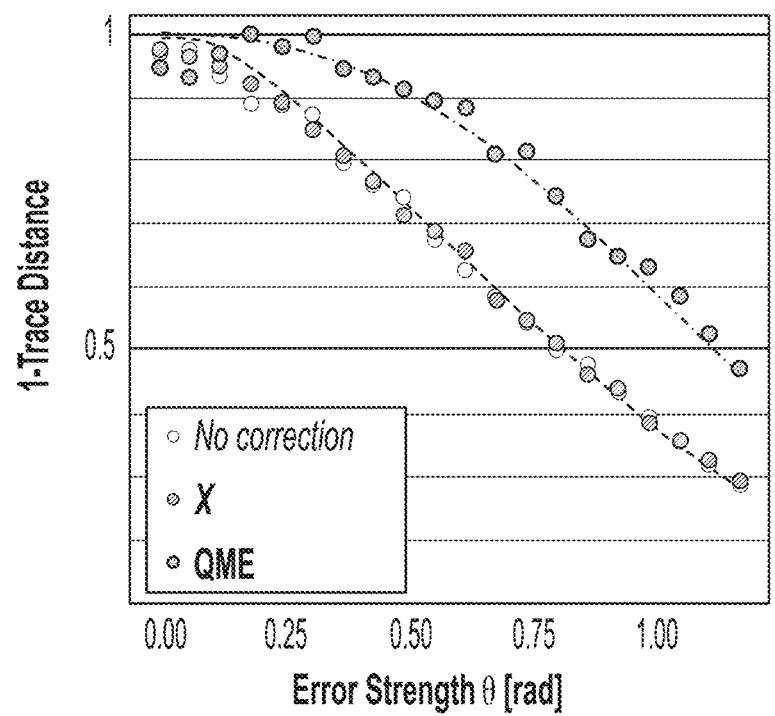
FIG. 9B is a plot, for the quantum circuit of FIG. 9A, showing a relationship between trace distance between a desired quantum state and measured quantum states and error strength after performing no error mitigation, after deterministically applying an X gate, and after performing a quantum measurement emulation by stochastically applying an X gate, in accordance with some embodiments described herein.

FIG. 9B is a plot, for the quantum circuit of FIG. 9A having two qubits, showing relationships between the trace distance and error strength after performing no error mitigation, after deterministically applying an X gate, and after stochastically applying an X gate to perform quantum measurement emulations, in accordance with some embodiments described herein. The values plotted on the y-axis of FIG. 9B show 1–(trace distance). As can be seen from the plot of FIG. 9B, the qubit state after performance of quantum measurement emulations has, for all error strengths, a reduced trace distance between the qubit states and the desired |1⟩ state prepared by state preparation 902 of FIG. 9A.

Figure 10A:
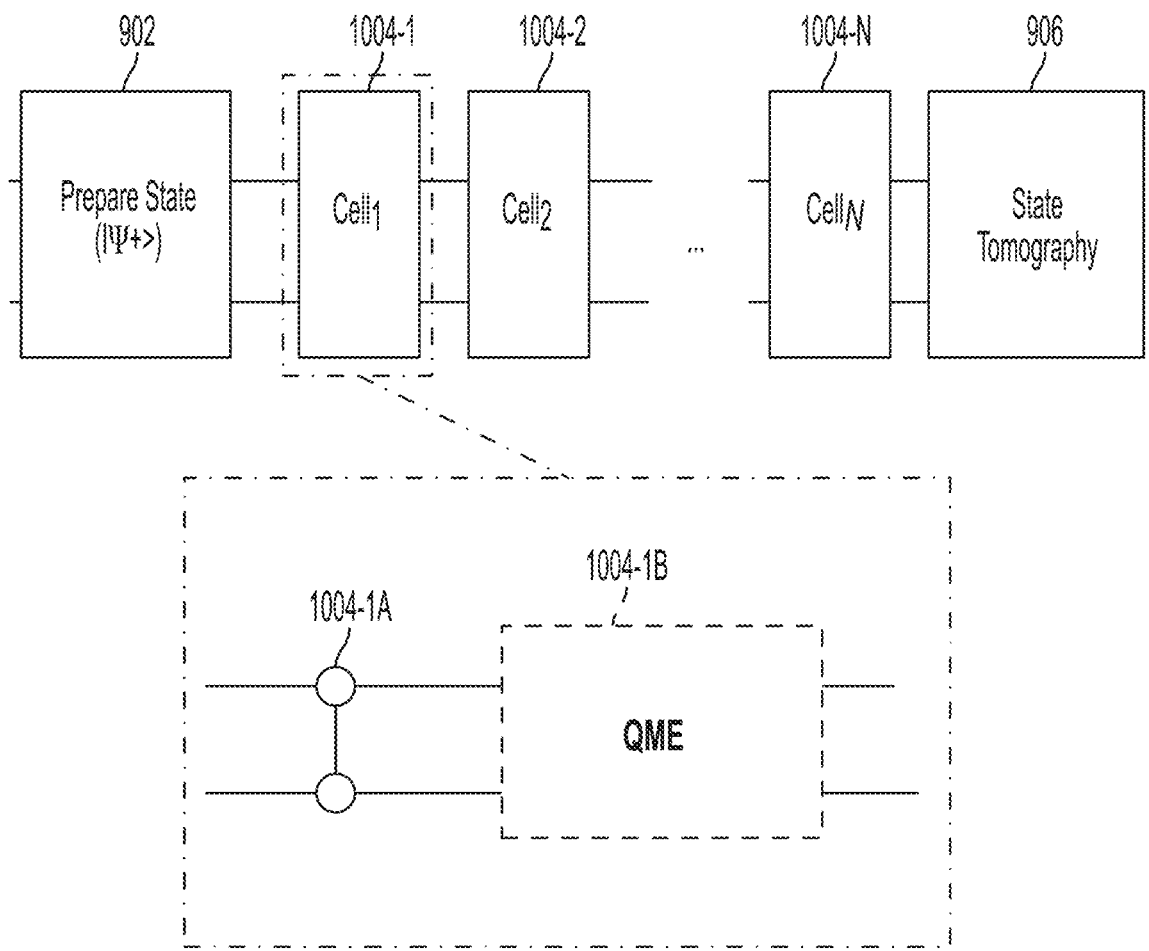
FIG. 10A is a schematic diagram of a quantum circuit including two qubits and a plurality of quantum operations, in accordance with some embodiments described herein.

FIG. 10A is a schematic diagram of a quantum circuit including two qubits and a plurality of quantum gates, in accordance with some embodiments described herein. The quantum circuit of FIG. 10A may be configured to show the effectiveness of repeated quantum measurement emulations during a quantum algorithm having many quantum gates.

The quantum circuit includes a first qubit and a second qubit, indicated by the two parallel lines running from left to right through the quantum circuit diagram. The states of the first qubit and the second qubit may be prepared by any suitable method at state preparation 902. In the example of FIG. 10A, the states of the qubits may be prepared along the x-axis and to store two bits both in the |1⟩ state. The quantum circuit may then include a number of cells 1004-1 through 1004-N. Each cell may include an arbitrary quantum gate 1004-NA followed by a quantum measurement emulation 1004-NB. In the example of FIG. 10A, the arbitrary quantum gate 1004-NA is shown as a Controlled-Z (CZ) gate (also known as a Controlled-Phase gate), but it may be appreciated that any quantum gate configured to act on the states of two qubits may be implemented as arbitrary quantum gate 1004-1A through 1004-NA.

Figure 10B:
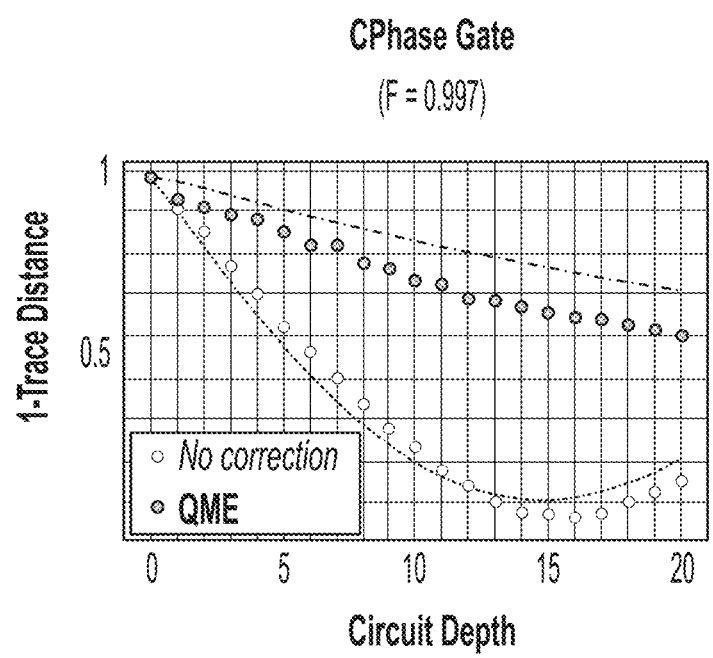
FIG. 10B is a plot, showing a relationship between trace distance between a desired quantum state and a measured quantum state and circuit depth for a quantum circuit in which no error mitigation is performed and for the quantum circuit of FIG. 10A which includes quantum measurement emulations, in accordance with some embodiments described herein.

FIG. 10B is a plot, for the quantum circuit of FIG. 10A, showing relationships between trace distances between a desired quantum state and measured quantum states and circuit depth, in accordance with some embodiments described herein. The values plotted on the y-axis of FIG. 9B show 1−(trace distance), and the dashed lines are fits to the data points, where the free parameter is the error in the CZ gate 1004-NA. The circuit depth describes the number of cells (e.g., 1004-1 through 1004-N) that are present in the quantum circuit prior to measuring the qubit states. The plot of FIG. 10B shows that, when no error mitigation is applied (e.g., no quantum measurement emulations 1004-1B through 1004-NB are present), the trace distance between the desired quantum states and the measured quantum states (e.g., a measure of error) grows rapidly with increasing circuit depth. In contrast, when quantum measurement emulations are applied after each arbitrary quantum gate of the quantum circuit, the trace distance grows less rapidly with increasing circuit depth and error is mitigated in the quantum states.

Figure 10C:
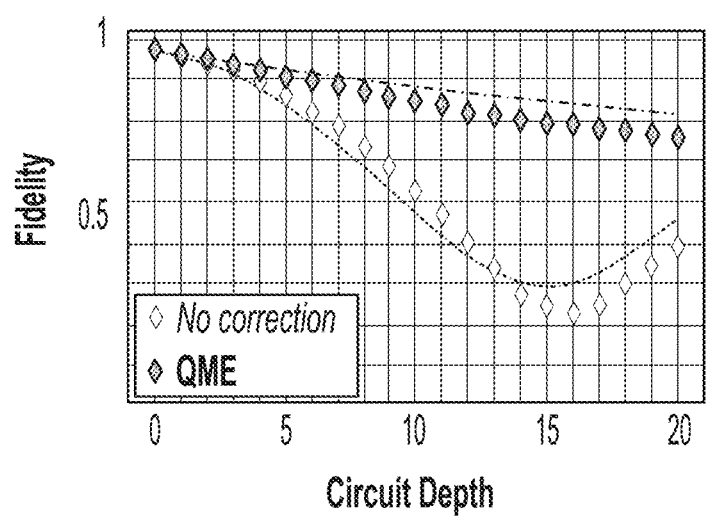
FIG. 10C is a plot showing a relationship between circuit fidelity and circuit depth for a quantum circuit in which no error mitigation is performed and for the quantum circuit of FIG. 10A which includes quantum measurement emulations, in accordance with some embodiments described herein.

FIG. 10C is a plot, for the quantum circuit of FIG. 10A, showing a relationship between fidelity of the quantum algorithm and circuit depth, in accordance with some embodiments described herein. The dashed lines are fits to the data points, where the free parameter is the error in the CZ gate 1004-NA. As with the plot of FIG. 10B, the plot of FIG. 10C shows that when no error mitigation is applied after each arbitrary quantum gate of the quantum circuit, the fidelity of the quantum algorithm rapidly increases with circuit depth. In contrast, the fidelity of the quantum algorithm is largely preserved, even for longer quantum algorithms, when quantum measurement emulations are interleaved with the arbitrary quantum gates performing the quantum computation.

Figure 11:
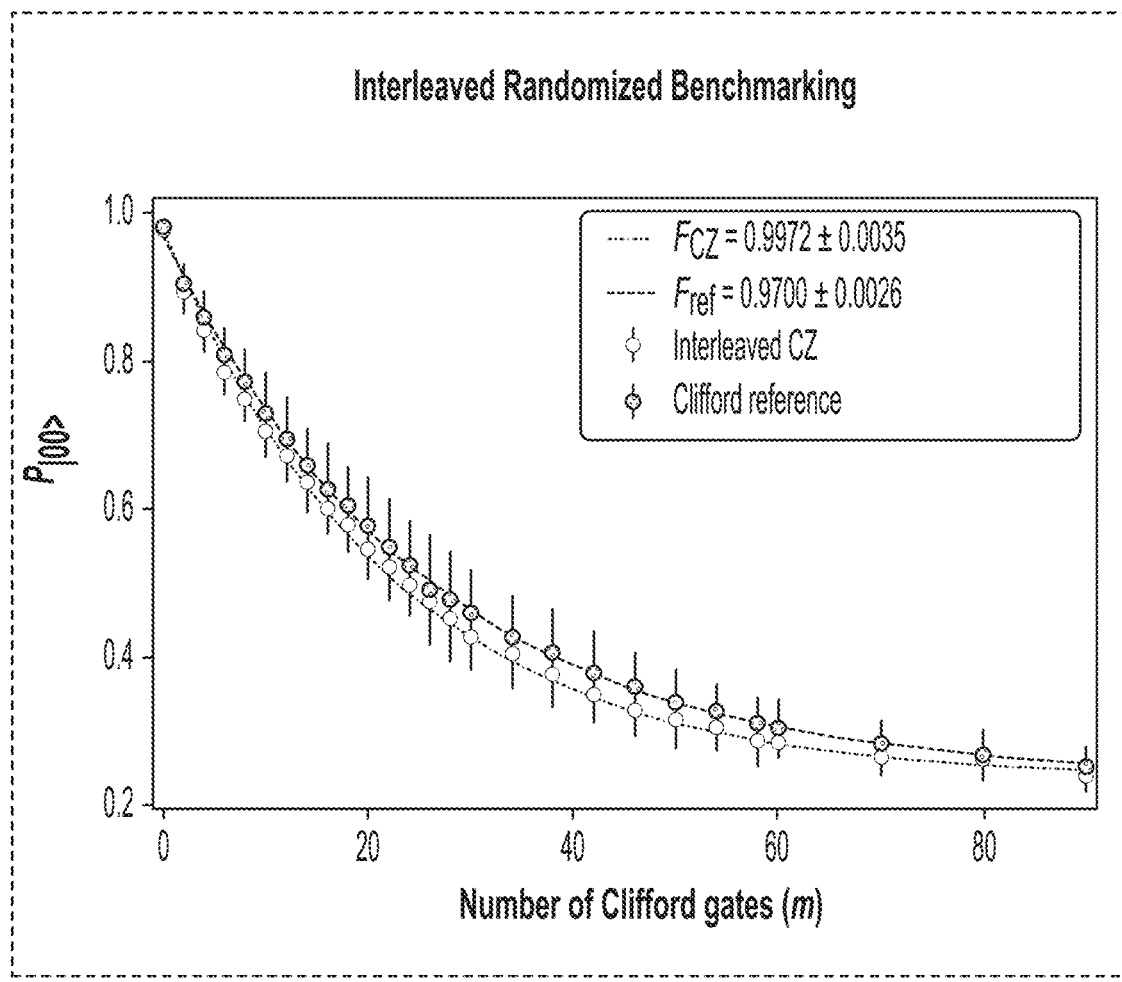
FIG. 11 is a plot showing, for an interleaved randomized benchmarking test, a relationship between a measured quantum state and circuit depth for the quantum gate used in FIGS. 10A-10C.

FIG. 11 is a plot showing, for an interleaved randomized benchmarking test, a relationship between a measured quantum state and circuit depth for the CZ gate 1004-NA of FIGS. 10A-10C. An interleaved random benchmarking test can provide an estimate of the average error associated with a quantum gate by comparing the fidelity of a reference series of Clifford gates with the fidelity of a series of Clifford gates interleaved with the quantum gate of interest. In the example of FIG. 11, the interleaved gate is the gate 1004-1A through 1004-NA of FIG. 10A that includes a Controlled-Z gate, not including the quantum measurement emulations 1004-1B through 1004-NB. As can be seen from the example of FIG. 11, the series of Clifford gates interleaved with the cells 1004-1A through 1004-NA provide a higher fidelity of 0.9972±0.0035 as compared to the quantum circuit including only Clifford gates, which provides a fidelity of 0.9700±0.0026. Techniques operating according to the principles described herein may be implemented in any suitable manner. Included in the discussion above are a series of flow charts showing the steps and acts of various processes that non-invasively control targeted neural activity. The processing and decision blocks of the flow charts above represent steps and acts that may be included in algorithms that carry out these various processes. Algorithms derived from these processes may be implemented as software integrated with and directing the operation of one or more single- or multi-purpose processors, may be implemented as functionally-equivalent circuits such as a Digital Signal Processing (DSP) circuit or an Application-Specific Integrated Circuit (ASIC), or may be implemented in any other suitable manner. It should be appreciated that the flow charts included herein do not depict the syntax or operation of any particular circuit or of any particular programming language or type of programming language. Rather, the flow charts illustrate the functional information one skilled in the art may use to fabricate circuits or to implement computer software algorithms to perform the processing of a particular apparatus carrying out the types of techniques described herein. It should also be appreciated that, unless otherwise indicated herein, the particular sequence of steps and/or acts described in each flow chart is merely illustrative of the algorithms that may be implemented and can be varied in implementations and embodiments of the principles described herein.

Accordingly, in some embodiments, the techniques described herein may be embodied in computer-executable instructions implemented as software, including as application software, system software, firmware, middleware, embedded code, or any other suitable type of computer code. Such computer-executable instructions may be written using any of a number of suitable programming languages and/or programming or scripting tools, and also may be compiled as executable machine language code or intermediate code that is executed on a framework or virtual machine.

When techniques described herein are embodied as computer-executable instructions, these computer-executable instructions may be implemented in any suitable manner, including as a number of functional facilities, each providing one or more operations to complete execution of algorithms operating according to these techniques. A "functional facility," however instantiated, is a structural component of a computer system that, when integrated with and executed by one or more computers, causes the one or more computers to perform a specific operational role. A functional facility may be a portion of or an entire software element. For example, a functional facility may be implemented as a function of a process, or as a discrete process, or as any other suitable unit of processing. If techniques described herein are implemented as multiple functional facilities, each functional facility may be implemented in its own way; all need not be implemented the same way. Additionally, these functional facilities may be executed in parallel and/or serially, as appropriate, and may pass information between one another using a shared memory on the computer(s) on which they are executing, using a message passing protocol, or in any other suitable way.

Generally, functional facilities include routines, programs, objects, components, data structures, etc. that perform particular tasks or implement particular abstract data types. Typically, the functionality of the functional facilities may be combined or distributed as desired in the systems in which they operate. In some implementations, one or more functional facilities carrying out techniques herein may together form a complete software package. These functional facilities may, in alternative embodiments, be adapted to interact with other, unrelated functional facilities and/or processes, to implement a software program application, for example as a software program application such as error mitigation facility 122 of FIG. 1. In other implementations, the functional facilities may be adapted to interact with other functional facilities in such a way as form an operating system, including the Windows® operating system, available from the Microsoft® Corporation of Redmond, Wash. In other words, in some implementations, the functional facilities may be implemented alternatively as a portion of or outside of an operating system.

Some exemplary functional facilities have been described herein for carrying out one or more tasks. It should be appreciated, though, that the functional facilities and division of tasks described is merely illustrative of the type of functional facilities that may implement the exemplary techniques described herein, and that embodiments are not limited to being implemented in any specific number, division, or type of functional facilities. In some implementations, all functionality may be implemented in a single functional facility. It should also be appreciated that, in some implementations, some of the functional facilities described herein may be implemented together with or separately from others (i.e., as a single unit or separate units), or some of these functional facilities may not be implemented.

Computer-executable instructions implementing the techniques described herein (when implemented as one or more functional facilities or in any other manner) may, in some embodiments, be encoded on one or more computer-readable media to provide functionality to the media. Computer-readable media include magnetic media such as a hard disk drive, optical media such as a Compact Disk (CD) or a Digital Versatile Disk (DVD), a persistent or non-persistent solid-state memory (e.g., Flash memory, Magnetic RAM, etc.), or any other suitable storage media. Such a computer-readable medium may be implemented in any suitable manner, including as computer-readable storage media 1206 of FIG. 12 described below (i.e., as a portion of a computing device 1200) or as a stand-alone, separate storage medium. As used herein, "computer-readable media" (also called "computer-readable storage media") refers to tangible storage media. Tangible storage media are non-transitory and have at least one physical, structural component. In a "computer-readable medium," as used herein, at least one physical, structural component has at least one physical property that may be altered in some way during a process of creating the medium with embedded information, a process of recording information thereon, or any other process of encoding the medium with information. For example, a magnetization state of a portion of a physical structure of a computer-readable medium may be altered during a recording process.

Figure 12:
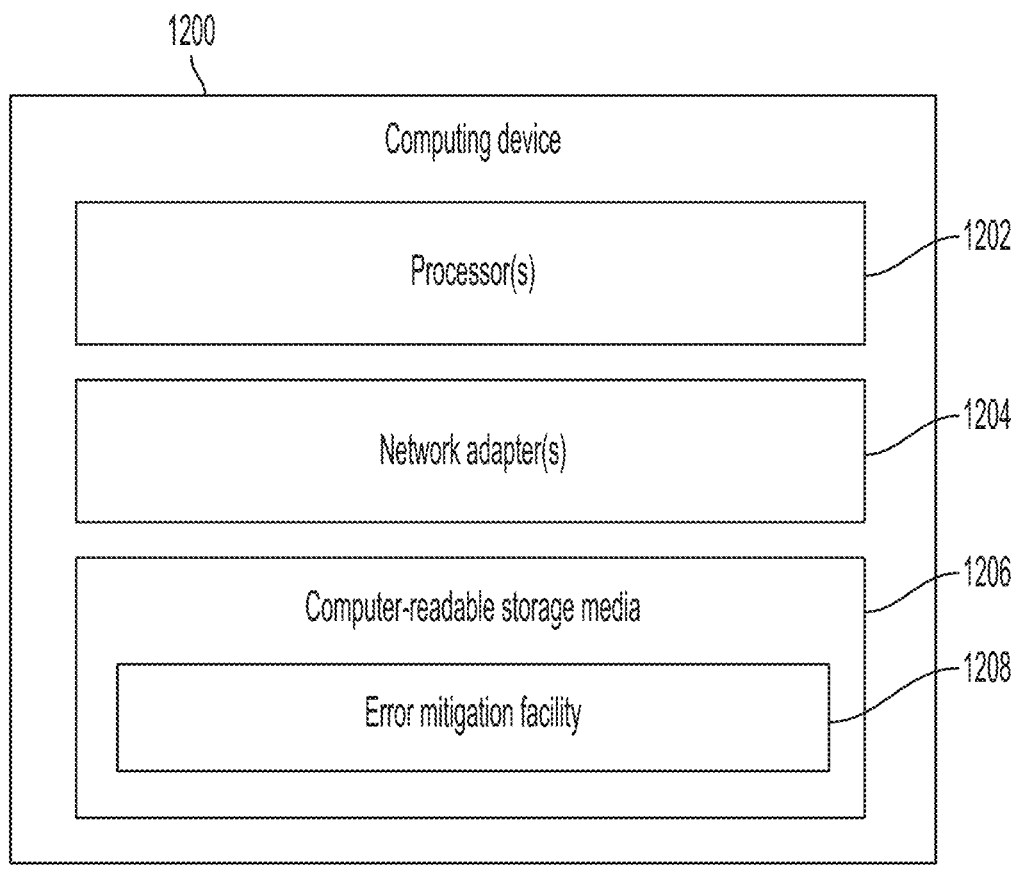
FIG. 12 is a schematic diagram of an illustrative computing device with which aspects described herein may be implemented.

In some, but not all, implementations in which the techniques may be embodied as computer-executable instructions, these instructions may be executed on one or more suitable computing device(s) operating in any suitable computer system, including the exemplary computer system of FIG. 12, or one or more computing devices (or one or more processors of one or more computing devices) may be programmed to execute the computer-executable instructions. A computing device or processor may be programmed to execute instructions when the instructions are stored in a manner accessible to the computing device or processor, such as in a data store (e.g., an on-chip cache or instruction register, a computer-readable storage medium accessible via a bus, a computer-readable storage medium accessible via one or more networks and accessible by the device/processor, etc.). Functional facilities comprising these computer-executable instructions may be integrated with and direct the operation of a single multi-purpose programmable digital computing device, a coordinated system of two or more multi-purpose computing device sharing processing power and jointly carrying out the techniques described herein, a single computing device or coordinated system of computing devices (co-located or geographically distributed) dedicated to executing the techniques described herein, one or more Field-Programmable Gate Arrays (FPGAs) for carrying out the techniques described herein, or any other suitable system.

FIG. 12 illustrates one exemplary implementation of a computing device in the form of a computing device 1200 that may be used in a system implementing techniques described herein, although others are possible. It should be appreciated that FIG. 12 is intended neither to be a depiction of necessary components for a computing device to operate as a stimulus system console in accordance with the principles described herein, nor a comprehensive depiction.

Computing device 1200 may comprise at least one processor 1202, a network adapter 1204, and computer-readable storage media 1206. Computing device 1200 may be, for example, a desktop or laptop personal computer, a personal digital assistant (PDA), a smart mobile phone, a server, a wireless access point or other networking element, or any other suitable computing device. Network adapter 1204 may be any suitable hardware and/or software to enable the computing device 1200 to communicate wired and/or wirelessly with any other suitable computing device over any suitable computing network. The computing network may include wireless access points, switches, routers, gateways, and/or other networking equipment as well as any suitable wired and/or wireless communication medium or media for exchanging data between two or more computers, including the Internet. Computer-readable media 1206 may be adapted to store data to be processed and/or instructions to be executed by processor 1202. Processor 1202 enables processing of data and execution of instructions. The data and instructions may be stored on the computer-readable storage media 1206.

The data and instructions stored on computer-readable storage media 1206 may comprise computer-executable instructions implementing techniques which operate according to the principles described herein. In the example of FIG. 12, computer-readable storage media 1206 stores computer-executable instructions implementing various facilities and storing various information as described above. Computer-readable storage media 1206 may store error mitigation facility 1208 and/or generated stimulus inputs.

While not illustrated in FIG. 12 a computing device may additionally have one or more components and peripherals, including input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computing device may receive input information through speech recognition or in other audible format.

Embodiments have been described where the techniques are implemented in circuitry and/or computer-executable instructions. It should be appreciated that some embodiments may be in the form of a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Various aspects of the embodiments described above may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

The word "exemplary" is used herein to mean serving as an example, instance, or illustration. Any embodiment, implementation, process, feature, etc. described herein as exemplary should therefore be understood to be an illustrative example and should not be understood to be a preferred or advantageous example unless otherwise indicated.

Having thus described several aspects of at least one embodiment, it is to be appreciated that various alterations, modifications, and improvements will readily occur to those skilled in the art. Such alterations, modifications, and improvements are intended to be part of this disclosure, and are intended to be within the spirit and scope of the principles described herein. Accordingly, the foregoing description and drawings are by way of example only.

What is claimed is:

1. A quantum information processing system comprising:
   a quantum computer including a first qubit; and
   an apparatus coupled to the first qubit and configured to perform quantum error mitigation on a quantum state stored in the first qubit by:
   stochastically determining, with a predetermined probability, whether to apply a quantum gate to the quantum state stored in the first qubit; and
   in response to determining to apply the quantum gate to the quantum state stored in the first qubit, generating and transmitting instructions to cause application of the quantum gate to the quantum state stored in the first qubit;
   wherein the quantum computer is configured to, in response to receiving the instructions from the apparatus, alter the quantum state stored in the first qubit by applying the quantum gate to the quantum state stored in the first qubit to perform a quantum operation on the quantum state stored in the first qubit.

2. The quantum information processing system of claim 1, wherein the first qubit is a superconducting qubit.

3. The quantum information processing system of claim 1, wherein the predetermined probability is 0.5.

4. The quantum information processing system of claim 1, wherein the apparatus stochastically determines whether to apply the quantum gate using a random number generator.

5. The quantum information processing system of claim 1, further comprising a second qubit of the quantum computer coupled to the first qubit, wherein the apparatus is coupled to the second qubit and further configured to:
   stochastically determine whether to apply the quantum gate to the quantum state stored in the first qubit and to a quantum state stored in the second qubit; and
   in response to determining to apply the quantum gate to the quantum state stored in the first qubit and to the quantum state stored in the second qubit, generating and transmitting instructions to cause application of the quantum gate to the quantum states stored in the first and second qubits;
   wherein the quantum computer is further configured to, in response to receiving the instructions from the apparatus, alter the quantum states stored in the first and second qubits by applying the quantum gate to the quantum states stored in the first qubit and the second qubit to perform a quantum operation on the quantum states stored in the first and second qubits.

6. The quantum information processing system of claim 1, wherein the quantum computer is further configured to apply the quantum gate to the quantum state stored in the first qubit by generating a stimulus signal to be applied to the quantum state stored in the first qubit.

7. A method of performing quantum error mitigation, the method comprising:
   stochastically determining, with a predetermined probability, whether to apply a quantum gate to a quantum state stored in a first qubit;
   in response to determining to apply the quantum gate, generating and transmitting instructions, using an apparatus coupled to a quantum computer including the first qubit, to cause application of the quantum gate; and
   applying, using the quantum computer, the quantum gate to the quantum state and altering the quantum state stored in the first qubit to perform a quantum operation on the quantum state stored in the first qubit.

8. The method of claim 7, further comprising:
   stochastically determining, with a predetermined probability, whether to apply the quantum gate to a quantum state stored in a second qubit of the quantum computer coupled to the first qubit; and
   in response to determining to apply the quantum gate to the quantum state stored in the first qubit and to the quantum state stored in the second qubit, generating and transmitting instructions to cause application of the quantum gate to the quantum states stored in the first and second qubits; and
   altering the quantum states stored in the first and second qubits by applying the quantum gate to the quantum states stored in the first qubit and the second qubit to perform a quantum operation on the quantum states stored in the first and second qubits.

9. The method of claim 8, further comprising, before stochastically determining whether to apply the quantum gate to the quantum states stored in the first qubit and the second qubit, applying an arbitrary quantum gate to the quantum states stored in the first qubit and the second qubit.

10. The method of claim 7, wherein stochastically determining whether to apply the quantum gate to the quantum state stored in the first qubit comprises using a random number generator.

11. The method of claim 7, wherein stochastically determining whether to apply the quantum gate to the quantum state stored in the first qubit with the predetermined probability comprises stochastically determining whether to apply the quantum gate with a probability of 0.5.

12. The method of claim 7, wherein applying the quantum gate to the quantum state stored in the first qubit comprises applying a quantum gate configured to perform a rotation of $\pi$ radians.

13. The method of claim 7, wherein the first qubit is a superconducting qubit and applying the quantum gate to the quantum state stored in the first qubit comprises applying a microwave signal to the first qubit.

14. A computer-readable storage medium encoded with computer-executable instructions that, when executed by a computer, cause the computer to carry out a method of quantum error mitigation, the method comprising:
   stochastically determining, with a predetermined probability, whether to apply a quantum gate to a quantum state stored in a first qubit of a quantum computer; and
   in response to determining to apply the quantum gate to the quantum state stored in the first qubit, generating and transmitting instructions to cause application of the quantum gate to the quantum state stored in the first qubit by the quantum computer,
   wherein the generated and transmitted instructions are configured to cause the quantum computer to alter the quantum state stored in the first qubit by applying the quantum gate to the quantum state stored in the first qubit to perform a quantum operation on the quantum state stored in the first qubit.

15. The computer-readable storage medium of claim 14, wherein the method further comprises:
   stochastically determining, with a predetermined probability, whether to apply the quantum gate to a quantum state stored in a second qubit of the quantum computer coupled to the first qubit; and
   in response to determining to apply the quantum gate to the quantum state stored in the second qubit, generating and transmitting instructions to cause application of the quantum gate to the quantum state stored in the second qubit by the quantum computer,
   wherein the generated and transmitted instructions are configured to cause the quantum computer to alter the quantum state stored in the second qubit by applying the quantum gate to the quantum state stored in the second qubit to perform a quantum operation on the quantum state stored in the second qubit.

16. The computer-readable storage medium of claim 15, the method further comprising, before stochastically determining whether to apply the quantum gate to the quantum states stored in the first qubit and the second qubit, applying an arbitrary quantum gate to the quantum states stored in the first qubit and the second qubit.

17. The computer-readable storage medium of claim 14, wherein stochastically determining whether to apply the quantum gate to the quantum state stored in the first qubit comprises using a random number generator.

18. The computer-readable storage medium of claim 14, wherein stochastically determining whether to apply the quantum gate to the quantum state stored in the first qubit with the predetermined probability comprises stochastically determining whether to apply the quantum gate with a probability of 0.5.

19. The computer-readable storage medium of claim 14, wherein applying the quantum gate to the quantum state stored in the first qubit comprises applying a quantum gate configured to perform a rotation of 7C radians.

20. The computer-readable storage medium of claim 14, wherein the first qubit is a superconducting qubit and applying the quantum gate to the quantum state stored in the first qubit comprises applying a microwave signal to the first qubit.

* * * * *

UNITED STATES PATENT AND TRADEMARK OFFICE
CERTIFICATE OF CORRECTION

| | | |
|---|---|---|
| PATENT NO. | : 11,715,026 B2 | Page 1 of 1 |
| APPLICATION NO. | : 16/917710 | |
| DATED | : August 1, 2023 | |
| INVENTOR(S) | : William Oliver et al. | |

It is certified that error appears in the above-identified patent and that said Letters Patent is hereby corrected as shown below:

In the Specification

At Column 1, Lines 7-11, in the paragraph under the heading "GOVERNMENT SUPPORT":
"This invention was made with Government support under Grant No. FA8702-15-D-0001 awarded by the U.S. Air Force, and under Grant No. W911NF-18-1-0411 awarded by the Army Research Office (ARO). The Government has certain rights in the invention."

Should read:
--This invention was made with government support under W911NF-18-1-0411 awarded by the U.S. Army Research Office, and FA8702-15-D-0001 awarded by the U.S. Air Force. The government has certain rights in the invention.--

In the Claims

In Claim 19, at Column 22, Lines 30-33:
"The computer-readable storage medium of claim 14, wherein applying the quantum gate to the quantum state stored in the first qubit comprises applying a quantum gate configured to perform a rotation of 7C radians."

Should read:
--The computer-readable storage medium of claim 14, wherein applying the quantum gate to the quantum state stored in the first qubit comprises applying a quantum gate configured to perform a rotation of $\pi$ radians.--

Signed and Sealed this
Third Day of October, 2023

*Katherine Kelly Vidal*

Katherine Kelly Vidal
*Director of the United States Patent and Trademark Office*